United States Patent [19]

Nakabayashi

[11] Patent Number: 5,028,871
[45] Date of Patent: * Jul. 2, 1991

[54] MAGNETIC RESONANCE IMAGING SYSTEM

[75] Inventor: Kazuto Nakabayashi, Ootawara, Japan

[73] Assignee: Kabushiki Kaisha Toshiba, Kawasaki, Japan

[*] Notice: The portion of the term of this patent subsequent to Aug. 21, 2007 has been disclaimed.

[21] Appl. No.: 400,006

[22] Filed: Aug. 29, 1989

[30] Foreign Application Priority Data

Aug. 31, 1988 [JP] Japan .................................. 63-214920

[51] Int. Cl.$^5$ ............................................ G01R 33/20
[52] U.S. Cl. ..................................................... 324/309
[58] Field of Search ................. 324/307, 309, 311, 312

[56] References Cited

U.S. PATENT DOCUMENTS

| | | | |
|---|---|---|---|
| 4,431,968 | 2/1984 | Edelstein et al. | 324/309 |
| 4,628,262 | 12/1986 | Maudsley | 324/309 |
| 4,716,369 | 12/1987 | Sekihara et al. | 324/309 |
| 4,733,184 | 3/1988 | McKinnon | 324/309 |
| 4,739,266 | 4/1988 | Kunz | 324/309 |
| 4,859,945 | 8/1989 | Stokar | 324/309 |

OTHER PUBLICATIONS

Cho et al., "Total Inhomogeneity Correction Including Chemical Shifts and Susceptibility by Viewing Tilting" Medical Physics, vol. 15, No. 1, Jan./Feb. 1988, pp. 7-11.

*Primary Examiner*—Michael J. Tokar
*Attorney, Agent, or Firm*—Foley & Lardner

[57] ABSTRACT

A magnetic resonance imaging system includes a static magnetic field generating section, a gradient magnetic field applying section, an RF pulse applying section, a sequence control section, a receiving section, and an imaging processing section. The sequence control section controls a sequence so as to generate a 180° pulse at a timing at which a peak of the 180° pulse appears at $t=TE'/2$, assuming that $TE'=TE-n\tau c$ (where TE is the echo time for a proton, $\tau c$ is the period in which phases of spins of water and fat match with each other and which is obtained on the basis of a chemical shift amount of protons of water and fat, and n is an integer of 1 or more), and a peak of a 90° pulse appears at $t=0$, generate a read gradient magnetic field Gr whose strength condition is set to cause an echo peak to appear at $t=TE=TE'+n\tau c$, and generate a slicing gradient magnetic field Gs whose strength condition is set to obtain a predetermined view angle $\theta = \tan -1(Gs/Gr)$ for reducing chemical shift artifacts upon generation of the read gradient magnetic field Gr.

6 Claims, 4 Drawing Sheets

MAGNETIC RESONANCE IMAGING SYSTEM

BACKGROUND OF THE INVENTION

1. Field of the Invention

The present invention relates to a magnetic resonance imaging (MRI) system for applying a gradient magnetic field and an RF pulse to an object to be examined which is placed in a static magnetic field so as to excite magnetic resonance at a specific portion of the object, and acquiring magnetic resonance (MR) echo signals excited by the magnetic resonance, thereby imaging the specific portion by a predetermined image reconstruction method using data based on the acquired MR echo signals and, more particularly, to an MRI system which allows an MR image with reduced chemical shift artifacts to be obtained by a hybrid echo method in which a spin echo method (to be referred to as an SE method hereinafter) using 90°–180° series RF pulses is improved to increase an S/N ratio.

2. Description of the Related Art

In a general medical MRI system, a gradient magnetic field and an RF pulse are applied to an object to be examined which is placed in a static magnetic field in accordance with a predetermined sequence for magnetic resonance excitation/MR data acquisition so as to cause an MR phenomenon at a specific portion of the object, and an MR signal excited by the MR phenomenon is detected. In addition, according to the system, data processing for imaging which includes image reconstruction is performed for MR data acquired in this manner so as to image anatomical information or quality information of the specific portion of the object.

An MRI system of this type generally comprises a static magnetic field generator, X-axis, Y-axis, and Z-axis gradient magnetic field generators, an RF transmitter, and an RF receiver. The X-axis, Y-axis, and Z-axis gradient magnetic field generators and the RF transmitter are driven in accordance with a predetermined sequence so as to generate X-axis, Y-axis, and Z-axis gradient magnetic fields Gx, Gy, and Gz and an RF pulse in accordance with a predetermined sequence pattern. As a result, magnetic resonance is excited to generate an MR signal, and the MR signal is received by the receiver. Predetermined image processing including image reconstruction processing is performed for the received MR data. In this manner, a tomographic image of a certain slice portion of an object to be examined is generated and displayed on a monitor.

In the sequence for magnetic resonance excitation/MR data acquisition, the X-axis, Y-axis, and Z-axis gradient magnetic fields Gx, Gy, and Gz are respectively used as, e.g., a read gradient magnetic field Gr, an encode gradient magnetic field Ge, and a slicing gradient magnetic field Gs.

One of the conventional MRI methods widely used in such a system is an imaging method employing the sequence of the SE method which uses 90°–180° series RF pulses.

Figure 1:
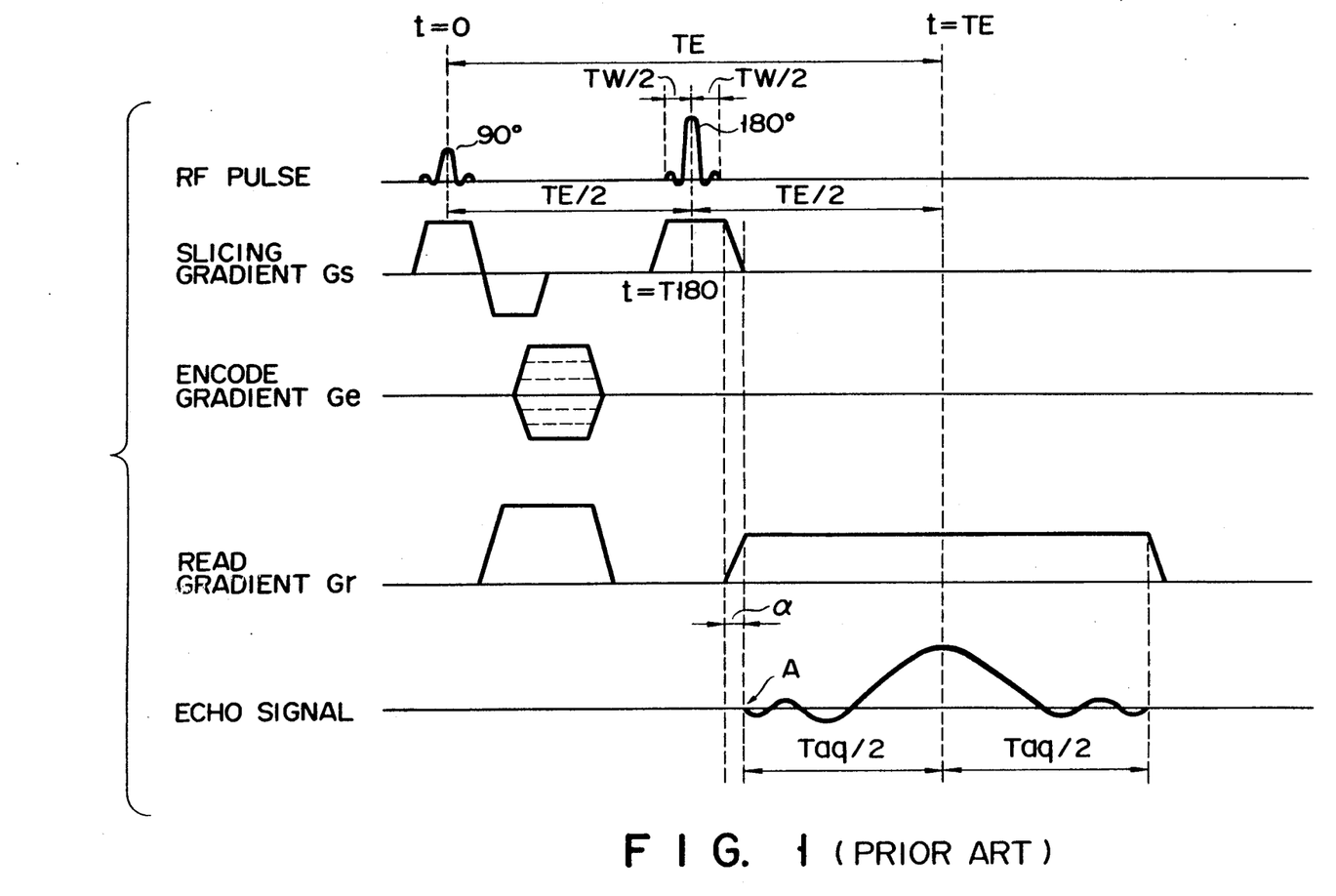
FIG. 1 is a timing chart showing a pulse sequence in a conventional MRI system.

The sequence of such a conventional SE method will be described below with reference to FIG. 1. FIG. 1 shows a sequence in one encode step.

A slicing gradient magnetic magnetic field Gs and a 90° selective excitation pulse as an RF magnetic field are applied to an object to be examined so as to excite a specific slice of the object (to flip the magnetization vector (to be referred to as "nuclear magnetization" hereinafter) of the nuclear spin of a specific atomic nucleus in the slice through 90°). Thereafter, an encode gradient magnetic field Ge having an amplitude corresponding to the encode step is applied to the object, and a 180° pulse as an RF magnetic field is applied to the object so as to invert the nuclear magnetization, thereby rephasing and refocusing the rotational phase of the nuclear magnetization (which has been dephased and dispersed upon application of the 90° pulse). In addition, a read gradient magnetic field Gr is applied to the object to generate a spin echo signal whose peak appears after a TE time (echo time) from the peak of the 90° pulse. While the read gradient magnetic field Gr is applied to the object, the MR echo signal is acquired.

The above-described sequence is repeated while the amplitude of the encode gradient magnetic field Ge, which is applied between application of 90° and 180° pulses, is changed by a predetermined value in every encode step.

In the sequence of the SE method, in order to minimize the influences of inhomogeneity of a static magnetic field, time t=0 at which a 90° pulse is applied, time t=T180 at which a 180° pulse is applied, and time t=TE at which the peak of a spin echo signal appears must satisfy the following equation:

$$T180 = TE/2$$

Preferably, the earliest timing at which echo signal acquistion can be started comes at a point A in FIG. 1 after application of a 180° pulse having a pulse time Tw, at which the leading edge of the read gradient magnetic field Gr is stabilized after the trailing edge of the slicing gradient magnetic field Gs. It is well known that the echo signal acquired when the read gradient magnetic field Gr is not stabilized adversely affects the resultant magnetic resonance image. If data acquisition is to be performed in a symmetrical manner with respect to the echo peak at time t=TE, an echo signal acquisition time Taq is limited as follows:

$$TE - Tw - 2\alpha \geq Taq$$

where $\alpha$ is either the fall time of a slicing gradient magnetic field Gs or the rise time of a read gradient magnetic field Gr. If the resolution remains the same, the upper limit of the time Taq is determined by TE, Tw, and $\alpha$. In addition, since the strength of a gradient magnetic field cannot be much decreased and $$\text{Noise} \propto 1/\sqrt{Taq}$$

the signal-to-noise (S/N) ratio cannot be increased.

As described above, according to the conventional system, a time ½ the echo time (the time interval between the peak of a 90° pulse and the peak of an echo signal) TE is set to be a time T180, and a 180° pulse is applied. That is, $$TE/2 = T180$$

Therefore, the upper limit of the echo signal acquisition time Taq is determined as $TE - Tw - 2\alpha \geq Taq$, and an increase in S/N ratio is undesirably limited when the resolution and the TE time remain the same.

In recent years, however, techniques for obtaining homogeneity of a static magnetic field has progressed in MRI systems, and hence inhomogeneity of a static magnetic field can be reduced to such an extent that no problem is posed in practical use.

SUMMARY OF THE INVENTION

It is an object of the present invention to provide an MRI system in which an observation time of an MR echo signal is prolonged to increase an S/N ratio with respect to a given resolution and a given TE time and to improve image quality.

An MRI system according to the present invention comprises a static magnetic field generating section for generating a homogeneous static field in a predetermined imaging volume, a gradient magnetic field applying section for applying a gradient magnetic field to the volume, an RF pulse applying section for applying RF pulses to the volume, a sequence control section for controlling the gradient magnetic field applying section and the RF pulse applying section in accordance with a predetermined sequence using a gradient magnetic field and 90°-180° series RF pulses based on a two-dimensional Fourier transform method, thereby causing an MR phenomenon, a receiving section for receiving an MR signal generated in the volume by the MR phenomenon, and an imaging processing section for performing predetermined processing including image reconstruction processing for the MR signal so as to obtain an MR image. The sequence control section is designed to generate a 180° pulse at a timing at which a peak of the 180° pulse appears at $t=TE'/2$, assuming that $TE'=TE-\tau n$ c (where TE is the echo time for a proton, $\tau c$ is the period in which phases of spins of water and fat match with each other and which is obtained on the basis of a chemical shift amount of protons of water and fat, and n is an integer of 1 or more), and a peak of a 90° pulse appears at $t=0$, generate a read gradient magnetic field Gr whose strength condition is set to cause an echo peak to appear at $t=TE=TE'+n\tau c$, and generate a slicing gradient magnetic field Gs whose strength condition is set to obtain a predetermined view angle $\theta=\tan^{-1}(Gs/Gr)$ for reducing chemical shift artifacts upon generation of the read gradient magnetic field Gr.

According to the MRI system of the present invention, the following effects can be obtained. An echo signal acquisition time can be set to be longer than that in the conventional SE method. In addition, chemical shift artifacts, which become a problem if the echo signal acquisition time is long, can be effectively compensated by properly setting a tilting view angle.

More specifically, (a) since Taq' can be set beyond the limitation of $TE-tw-2\alpha \geq Taq$, the echo signal acquisition time can be prolonged, and the S/N ratio can be increased, assuming that the resolution and the TE time remain the same. (b) The nuclear magnetization whose frequency shift occurs due to chemical shift with respect to a specific atomic nucleus, e.g., a proton, can be phase-matched at the echo peak. (c) If the TE time remains the same, the same contrast as that of the conventional system can be obtained. (d) With regard to spins in which frequency shift occurs due to factors other than chemical shift, their phases are not matched at the echo peak. Therefore, with respect to a portion in an object to be examined in which susceptibility locally varies, an echo signal exhibits the same characteristics as those of an echo signal obtained by a field echo method. That is, a portion whose susceptibility locally varies (e.g., nucleus ruber) can be expressed with a higher contrast than that in the normal SE method. (e) Since the echo signal acquisition time can be prolonged, chemical shift artifacts which may be produced when a read gradient magnetic field Gr is decreased in strength can be effectively reduced.

According to the MRI system of the present invention, therefore, chemical shift artifacts can be effectively reduced, and the S/N ratio with respect to a given resolution and a given TE time can be greatly increased.

DETAILED DESCRIPTION OF THE PREFERRED EMBODIMENTS

A sequence on which the present invention is based, i.e., a hybrid echo method (to be referred to as an "HE method" hereinafter) in which the normal SE method is improved to increase an S/N ratio will be described below prior to the description of an MRI system according to a first embodiment of the present invention. The HE method has been disclosed by the present inventors (U.S. patent application Ser. No. 07/354,762; inventors: Kazuto Nakabayashi and Masatoshi Hanawa; and title: "Magnetic Resonance Imaging System and Method").

The HE method is based on the normal SE method. In the HE method, the application timing of a 180° pulse is shifted toward the 90° pulse side by an interval corresponding to one period of a chemical shift so as to prolong a data acquisition time, so that the S/N ratio is increased to nearly $\sqrt{2}$ times that of the SE method.

More specifically, according to the HE method, $TE'=TE-n\tau c$ (where TE is the echo time for a proton, $\tau c$ is the period in which the phases of the nuclear magnetization of water and fat match with each other, and which is based on the chemical shift amount of the protons of water and fat, and n is an integer of 1 or more) is set. In this method, if the timing of the peak of a 90° pulse is represented by $t=0$, a 180° pulse is generated at a timing at which the timing of the peak of the 180° pulse is given by $t=TE'/2$, and a read gradient magnetic field Gr is generated while its strength is set to cause an echo peak to appear at a timing $t=TE=TE'+n\tau c$. According to this system, an echo signal acquisition time can be prolonged, and hence an S/N ratio can be increased, assuming that a resolution and a TE time remain the same. Even if nuclear magnetization causes frequency shift due to chemical shift with respect to a proton, its phase is matched at the echo peak. In addition, if frequency shift of nuclear magnetization occurs due to factors other than chemical shift, the pulse sequence can be set so as not to match its phase at the echo peak.

Since the time Taq' can be set beyond the limitation of $TE-tw-2\alpha \geq Taq$, the S/N ratio can be increased, assuming that the resolution and the TE time remain the same. In addition, if the TE time and TR time (repetition time) remain the same, the same contrast as that of the conventional system can be obtained. With regard to spins in which frequency shift occurs due to factors other than chemical shift, their phases do not match with the echo peak. Therefore, with respect to a portion in an object to be examined in which susceptibility locally varies, an echo signal exhibits the same characteristics as those of an echo signal obtained by a field echo method. That is, a portion whose susceptibility locally varies (e.g., nucleus ruber) can be expressed with a higher contrast than that in the normal SE method.

According to the HE method, therefore, an S/N ratio with respect to a given resolution and a given TE time can be increased.

A practical example of the HE method will be described in detail below with reference to FIG. 2.

The sequence of the HE method is based on the sequence of the SE method in which 90°–180° series RF pluses are applied, and is formed on the basis of the echo time TE of the sequence of the SE method as follows:

(1) The resonance frequency of a proton (hydrogen atomic nucleus) of water (contained in water) with respect to a static magnetic field generated by the system is obtained.

(2) Since the chemical shift amount of a proton of water and a proton of fat (contained in fat) can be as certained with respect to the resonance frequency, a time (period) $\tau c$ in which the phases of nuclear magnetization of water and fat match with each other is obtained in accordance with the following equation:

$\tau c$ (sec) = 1/[resonance frequency (Hz) of water
chemical shift amount (ppm) of water and fat]

(3) A time given by $TE - \tau c$ is set to be $TE'$ with respect to the predetermined echo time TE.

(4) Application timings of 90° and 180° pulses are determined such that the peaks of the 90° and 180° pulses respectively appear at time $t = 0$ and time $t = TE'/2$.

Figure 2:
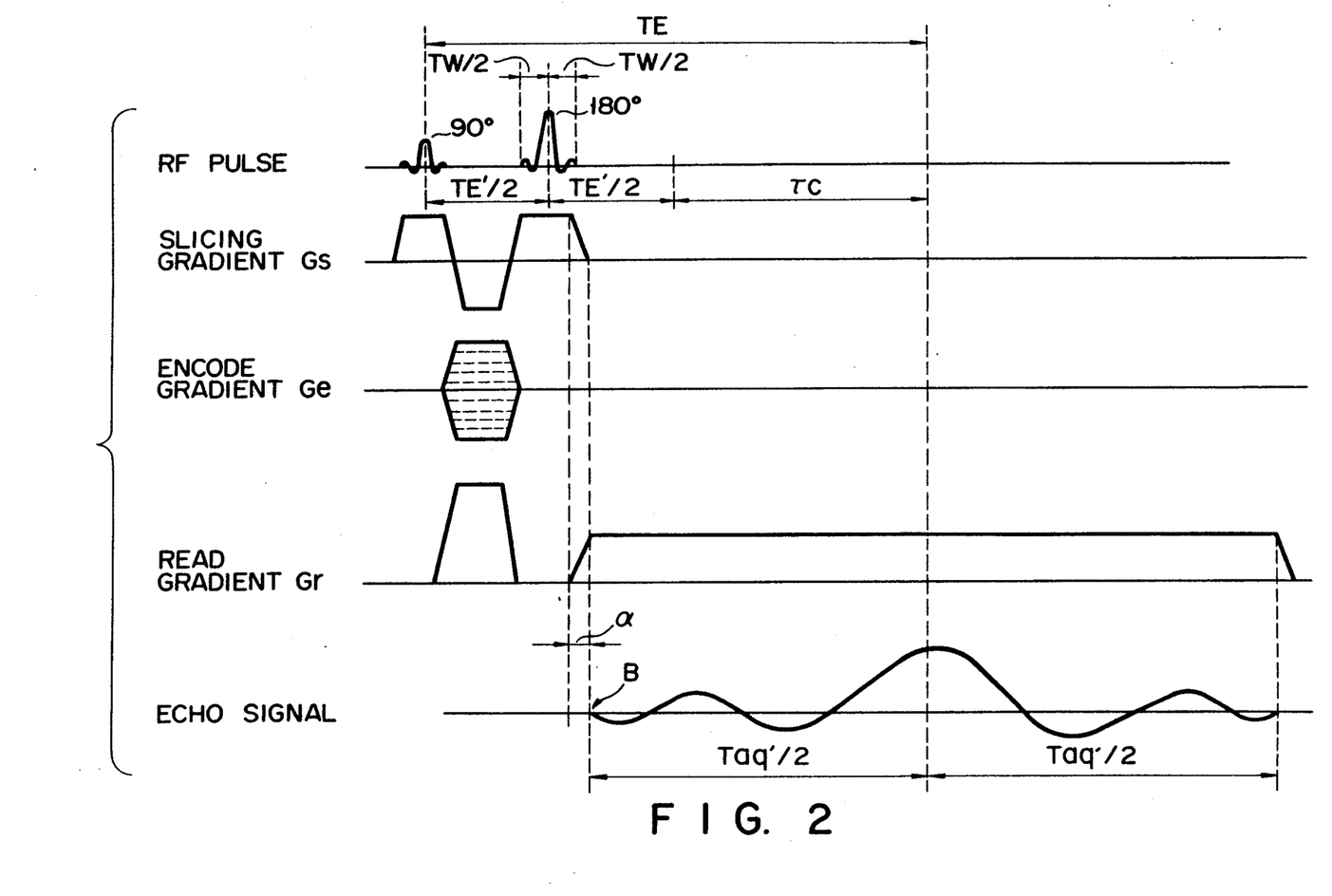
FIG. 2 is a timing chart for explaining a fundamental pulse sequence of a hybrid echo method which is employed in an MRI system of the present invention to obtain echos.

(5) The earliest timing at which data acquisition can be started is at a point B in FIG. 2 immediately after application of a 180° pulse. For example, when data acquisition is to be performed in a symmetrical manner with respect to the peak (time $t = TE$) of an echo signal, data acquisition can be performed in a time interval Taq'.

(6) A slicing gradient magnetic field Gs, a read gradient magnetic field Gr, and a phase encode gradient magnetic field Ge are basically controlled in the same manner as in the normal spin echo sequence. However, the strength of the read gradient magnetic field Gr is set such that an echo peak does not appear at time $t = TE'$ but appears at time $t = TE' + \tau c$, i.e., $t = TE$, and a desired resolution $\Delta l$ is obtained with respect to the time interval Taq'. In this case, the resolution $\Delta l$ is given as $\Delta l = 1/[Taq'$ strength of Gr in the time interval Taq], and a timing at which an echo peak appears is determined in association with the integral value of the read gradient magnetic field Gr before and after application of a 180° pulse (between application of a 90° pulse and that of a 180° pulse). Therefore, the strength of the read gradient magnetic field Gr in the time interval Taq' is set to satisfy the resolution $\Delta l$, and the strength of the read gradient magnetic field before application of a 180° pulse is determined to cause an echo peak to appear at time $t = TE1$.

Unlike the pulse sequence of the normal SE method, the pulse sequence of the HE method is susceptible to the influences of inhomogeneity of a static magnetic field. For this reason, an MRI system must be constructed by using a static magnetic field magnet system capable of obtaining a highly homogeneous static magnetic field. For example, if a static magnetic field strength is 0.5 T, a diameter of a spherical volume DSV (an imaging allowable volume, i.e., a spherical volume in which an imaging field is formed and approximately in which diagnosis can be performed) is preferably set to be 250 mm, and inhomogeneity is preferably set to be several ppm or less.

According to the above-described HE method, if condition (2) described above, i.e., $\tau c = 1/[$resonance frequency (Hz) of water [chemical shift amount (ppm) of water and fat], is satisfied, an image having substantially the same contrast with that of an image obtained by the conventional system can be obtained. If the resolution of an image remains the same, noise of the image can be reduced by a value corresponding to $1/\sqrt{(Taq'/Taq)}$. As a result, the S/N ratio can be increased.

In the HE method described above, since an echo signal is observed for a relatively long period of time so as to increase an S/N of an image under the condition that the resolution remains the same, the strength of a read gradient field Gr is preferably set to be low. For this reason, in the HE method, artifacts (geometric shift of the image of chemically shifted tissue occurs on a screen) due to chemical shift tend to appear on an image.

More specifically, when image acquisition is performed with the conventional SE method in a system using an field strength of, e.g., about 0.5 T, since the signal observation interval Taq is relatively short, chemical shift artifacts do not pose much problem.

In the HE method, since the interval Taq can be set to be longer than the above described limitation of the SE method, an S/N is decreased. However, since a gradient magnetic-filed Gr is set to be low, in image becomes susceptible to the influences of chemical shift artifacts.

According to the present invention, therefore, artifacts due to chemical shift caused since the strength of a read gradient magnetic field Gr is set to be low are effectively eliminated.

Figure 3:
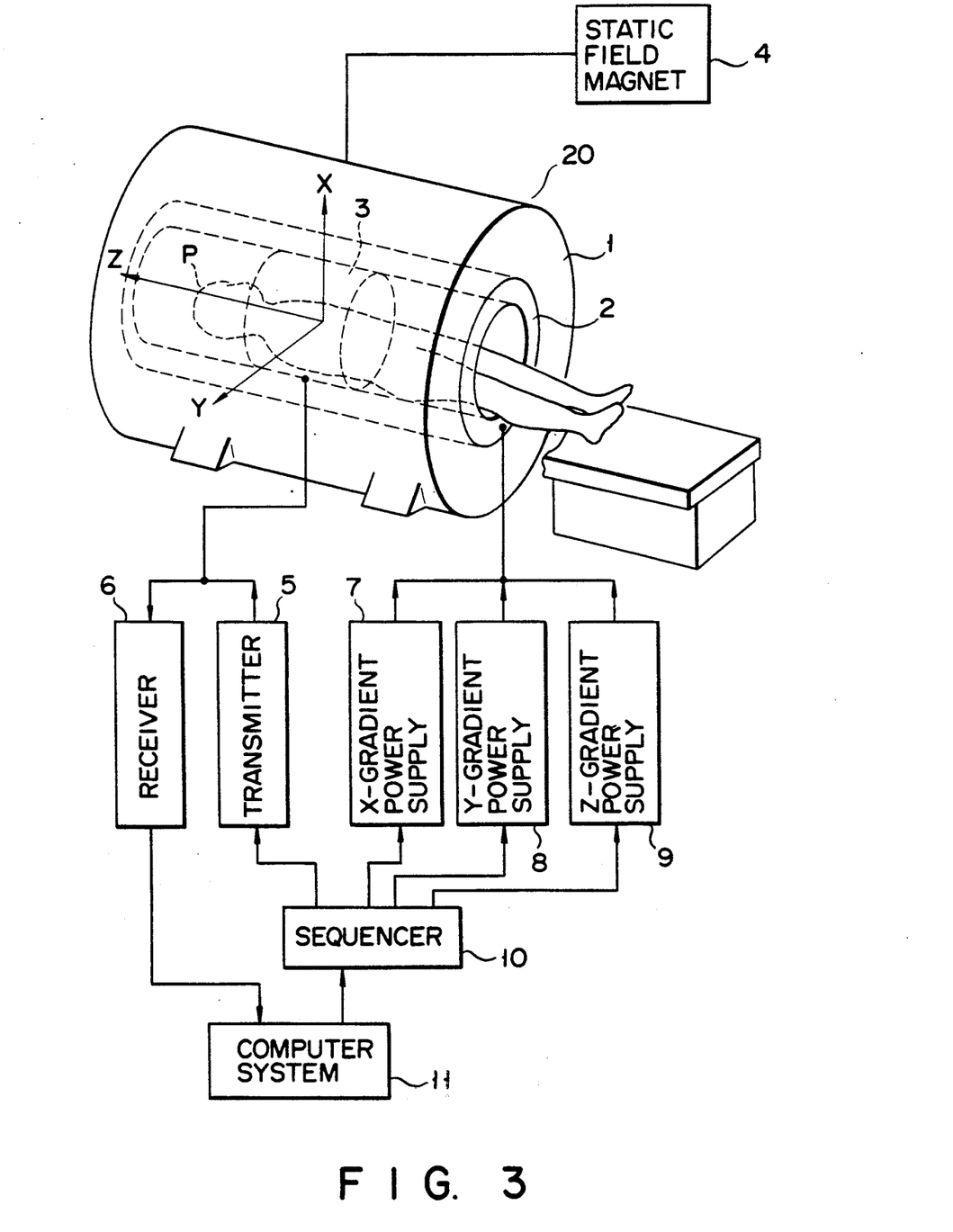
FIG. 3 is a block diagram showing an arrangement of an MRI system according to an embodiment of the present invention.

FIG. 3 shows an arrangement of an MRI system according to an embodiment of the present invention.

A static field magnet 1, X-axis, Y-axis, and Z-axis gradient magnetic field coils 2, and a transmitting-/receiving coil 3 are arranged in a gantry 20. The static field magnet 1 as a static field generator is constituted by, e.g., a superconductive coil or a normal conductive coil. The X-axis, Y-axis, and Z-axis gradient magnetic field coils 2 are coils for respectively generating X-axis, Y-axis, and Z-axis gradient magnetic fields Gx, Gy, and Gz. The transmitting/receiving coil 3 is used to generate an RF pulse and receive an MR signal generated by MR. An object (patient) P to be examined is inserted in an imaging allowable volume in the gantry 20. The static field magnet 1 is driven by a static field controller 4. The transmitting/receiving coil 3 is driven by a transmitter 5 when MR is excited, and is coupled to a receiver 6 when an MR signal is detected. The X-axis, Y-axis, and Z-axis gradient magnetic field coils 2 are respectively driven by X-, Y-, and Z-gradient power supplies 7, 8, and 9.

The X-, Y-, and Z-gradient power supplies 7, 8, and 9, and the transmitter 5 are driven by a sequencer 10 in accordance with a predetermined sequence so as to respectively generate X-axis, Y-axis, and Z-axis gradient magnetic fields Gx, Gy, and Gz, and RF pulses of, e.g., 90°-180° pulse series in accordance with a predetermined pulse sequence (to be described later). In this case, X-axis, Y-axis, and Z-axis gradient magnetic fields Gx, Gy, and Gz are mainly used as, e.g., a read gradient magnetic field Gr, an encode gradient magnetic field Ge, and a slicing gradient magnetic field Gs, respectively. A computer system 11 drives/controls the sequencer 10. In addition, the computer system 11 fetches a spin echo signal as an MR signal received by the receiver 6 and performs predetermined signal processing to generate tomographic image of a specific slice portion of an object to be examined, thus displaying it on a display monitor.

Figure 4:
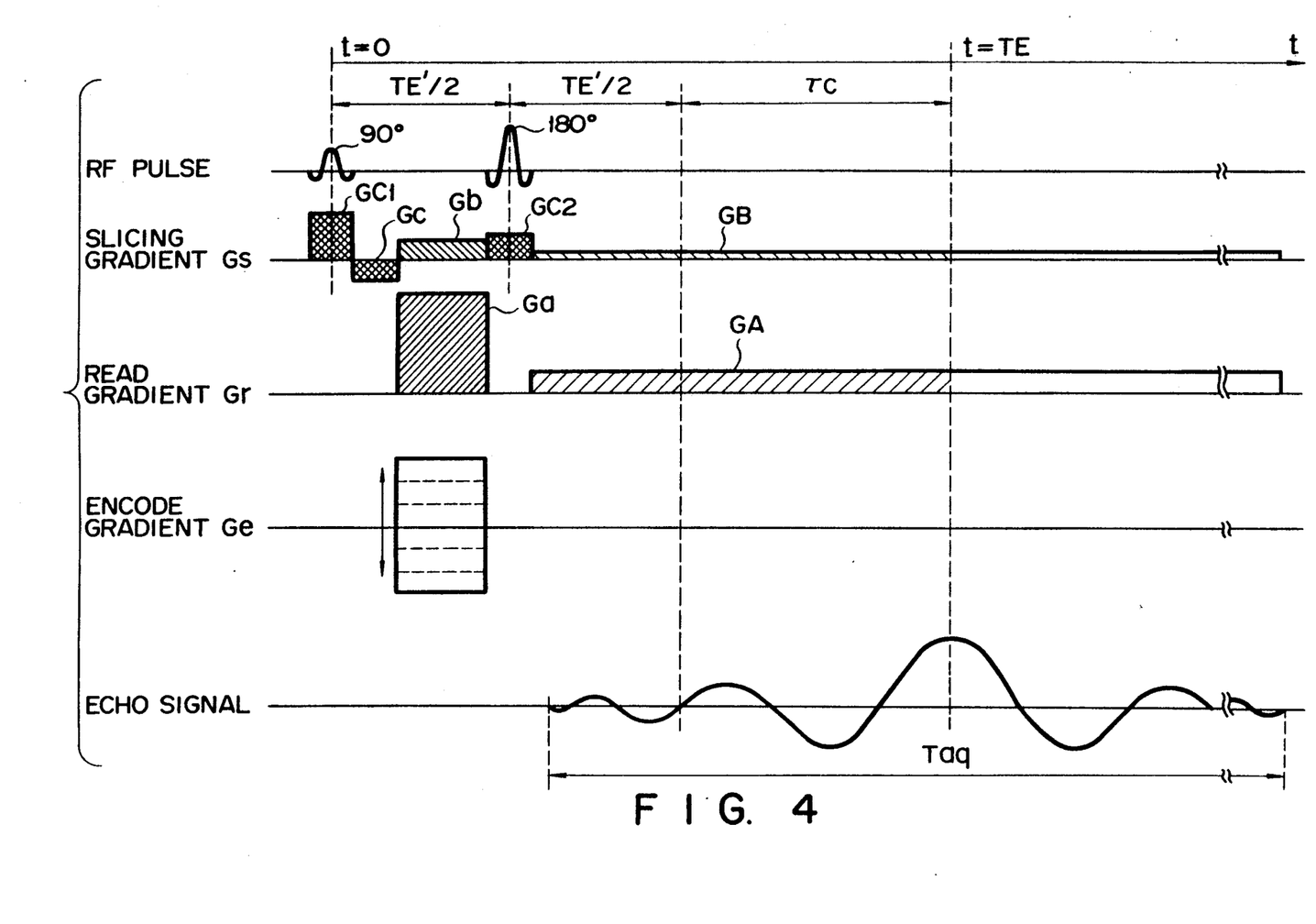
FIG. 4 is a timing chart for explaining a pulse sequence of the system in FIG. 3 in detail.

A pulse sequence for MR excitation/MR data acquisition in the above-described MRI system according to an embodiment of the present invention will be described below with reference to FIG. 4.

In the present invention, in order to solve the problem of chemical shift artifacts in the above-described HE method, a technique for reducing chemical shift artifacts by tilting a view angle which is proposed by Z. H. Cho, D. J. Kim, and Y. K. Kim, ("Total inhomogeneity correction including chemical shifts and susceptibility by view angle tilting", Medical Physics, Vol. 15, No 1, Jan./Feb. 1988) is improved and adapted.

More specifically, the sequence of this embodiment is designed as follows:

(1) A resonance frequency f0 of a proton in an apparatus to which the present invention is applied is obtained.

(2) A frequency fc of a spin chemically shifted due to fat is obtained, and a time $\tau c$ corresponding to one period of a differential frequency between the shifted spin and a spin which is not shifted is obtained by the following equation:

$$\tau c = 1/|f0 - fc|$$

In this case, a chemical shift amount ($|f0-fc|/f0$) is about 3 to 4 ppm, and the frequency f0 can be uniquely determined if the static magnetic field strength of the apparatus is determined. In addition, the time $\tau c$ may be set to a typical value within the range of chemical shift amounts.

(3) The timing of the sequence is set such that application of a 180° pulse is delayed with respect to application of a 90° pulse by a time corresponding to $(TE'/2) = \{(TE - \tau c)/2\}$ where TE is the echo time for a desired echo.

Items (1) to (3) above are the same as those in the normal HE method.

(4) The strength of a read gradient magnetic field Gr (GA in FIG. 4) is determined by a desired resolution, a tilting view angle $\theta$ (to be described later), and an echo observation interval Taq. The areas of hatched portions GA and Ga are adjusted to cause the peak of an MR echo signal to appear at t=TE (note it is not t=TE').

(5) Gradient magnetic field components (components GC1, GC2, and Gc in FIG. 4) of a slicing gradient magnetic field Gs which are applied at substantially the same timing as that of an RF pulse may be basically equivalent to those in the spin echo method. A gradient magnetic field GB as a slicing gradient magnetic field Gs (not used for slicing in this case) is applied at the same timing as that of a gradient magnetic field GA as a read gradient magnetic field Gr. The strength of the gradient magnetic field Gs (GB) is obtained in accordance with the strength of the gradient magnetic field Gr (GA) so as to obtain a desired "tilting view angle" $[\theta = \tan^{-1}(Gs/Gr)]$. In addition, the area of the waveform of a gradient magnetic field GB and that of a gradient magnetic field Gb (to be applied between fields Gc and Gc2) must be adjusted to be equal to each other in the range of t=0 to t=TE (note it is not t=0 to t=TE').

(6) A gradient magnetic field Ge for phase encoding may be controlled in the same manner as in the normal SE method. The earliest timing at which signal acquisition can be started comes immediately after application of a 180° pulse.

(7) Since gradient magnetic fields Gb and Gc have opposite polarities, their waveforms can be arbitrarily set as long as their areas are the same and satisfactory selective excitation can be performed within a time interval t=0 to t=(TE/2).

The following effects can be obtained by the above-described sequence.

In addition to the above-described effects of the HE method, further reduction in noise and chemical shift artifacts can be achieved.

More specifically, when image acquisition is performed with a short TE time of the conventional SE method (generally, 40 msec or less) in a system using an intermediate field strength of, e.g., about 0.5 T, since the signal observation interval Taq is relatively short, chemical shift artifacts do not pose much problem within the range in which the strength of a gradient magnetic field Gr is set to obtain a desired resolution.

In the HE method, however, since the interval Taq can be set to be long with respect to that of the SE method, if the resolution remains the same, noise in an image can be reduced more than in the SE method. However, since a gradient magnetic field Gr is set to be low, an image becomes susceptible to the influences of chemical shift artifacts. In the present invention, by applying the "tilting view angle" method to the HE method, the S/N ratio of an image can be further increased, and at the same time the influences of the above-described chemical shift artifacts can be reduced.

The present invention is not limited to the above embodiment. Various changes and modifications can be made within the spirit and scope of the invention.

For example, the present invention can be applied to a multi-echo sequence by the HE method. In this case, a tilting compensation gradient magnetic field (Gs) may be properly applied for the second and subsequent MR echo signals upon application of a read gradient magnetic field Gr for MR echo signals so as to obtain a desired view angle.

What is claimed is:

1. A magnetic resonance imaging system comprising:
    static magnetic field generating means for generating a sufficiently homogeneous static magnetic field in a predetermined imaging volume in which an object to be examined is placed;
    gradient magnetic field applying means for applying a gradient magnetic field to the imaging volume;
    RF pulse applying means for applying an RF pulse to the imaging volume;

sequence control means for controlling said gradient magnetic field applying means and said RF pulse applying means in accordance with a predetermined sequence so as to cause said gradient magnetic field applying means and said RF pulse applying means to respectively apply a predetermined gradient magnetic field and 90°-180° series RF pulses to the imaging volume to cause a magnetic resonance phenomenon in the imaging volume;

receiving means for receiving a magnetic resonance signal generated in the imaging volume by the magnetic resonance phenomenon; and imaging processing means for obtaining a magnetic resonance image by performing predetermined processing including image reconstruction processing for the magnetic resonance signal received by said receiving means, said sequence control means including means for generating a 180° pulse at a timing at which a peak of the 180° pulse appears at $t = TE'/2$, assuming that $TE' = TE - n\tau c$ (where TE is the echo time for a proton, $\tau c$ is the period in which phases of spins of water and fat match with each other and which is obtained on the basis of a chemical shift amount of protons of water and fat, and n is an integer not less than 1), and a peak of a 90° pulse appears at $t = 0$, means for generating a read gradient magnetic field Gr whose strength condition is set to cause an echo peak to appear at $t = TE = TE' + n\tau c$, and mean for generating a slicing gradient magnetic field Gs whose strength condition is set to obtain a predetermined view angle $\theta = \tan^{-1}(Gs/Gr)$ for reducing chemical shift artifacts upon generation of the read gradient magnetic field Gr and to cause an echo peak value to be maximum at the echo peak defined by the read gradient magnetic field Gr.

2. A system according to claim 1, wherein said sequence control means further comprises means for generating an encode gradient magnetic field Ge between application of 90° and 180° pulses, and means for generating a read gradient magnetic field Gr and a slicing gradient magnetic field Gs whose strengths are set in accordance with the strength conditions upon generation of the encode gradient magnetic field Ge.

3. A magnetic resonance imaging system including static magnetic field generating means for generating a sufficiently homogeneous static magnetic field in a predetermined imaging volume in which an object to be examined is placed, gradient magnetic field applying means for applying a gradient magnetic field to the imaging volume, RF pulse applying means for applying an RF pulse to the imaging volume, sequence control means for controlling said gradient magnetic field applying means and said RF pulse applying means in accordance with a predetermined sequence so as to cause said gradient magnetic field applying means and said RF pulse applying means to respectively apply a predetermined gradient magnetic field and 90°-180° series RF pulses to the imaging volume to cause a magnetic resonance phenomenon in the imaging volume, receiving means for receiving a magnetic resonance signal generated in the imaging volume by the magnetic resonance phenomenon, and imaging processing means for obtaining a magnetic resonance image by performing predetermined processing including image reconstruction processing for the magnetic resonance signal received by said receiving means, said sequence control means comprising:

means, including means for generating a 180° pulse at a timing at which a peak of the 180° pulse appears at $t = TE'/2$, assuming that $TE' = TE - n\tau c$ (where TE is the echo time for a proton, $\tau c$ is the period in which phases of spins of protons of water and fat match with each other and which is obtained on the basis of a chemical shift amount of protons of water and fat, and n is an integer not less than 1), and a peak of a 90° pulse appears at $t = 0$, and generating a read gradient magnetic field Gr whose strength condition is set to cause an echo peak to appear at $t = TE = TE' + n\tau c$, for obtaining a first magnetic resonance echo signal by sequentially applying 90° and 180° pulses to the object, means for generating an nth (n is a natural number not less than 2) magnetic resonance echo signal by repeatedly applying 180° pulses at predetermined intervals after generation of the first magnetic resonance echo signal, and means for generating a slicing gradient magnetic field Gs whose strength condition is set to obtain a predetermined view angle $\theta = \tan^{-1}(Gs/Gr)$ for reducing chemical shift artifacts upon generation of the read gradient magnetic field Gr and to cause an echo peak value to be maximum at the echo peak defined by the read gradient magnetic field Gr.

4. A magnetic resonance imaging method of applying a predetermined gradient magnetic field and 90°-180° series RF pulses to a predetermined imaging volume in a static magnetic field in which an object to be examined is placed to cause a magnetic resonance phenomenon in a predetermined portion in the imaging volume, receiving a magnetic resonance signal generated by the magnetic resonance phenomenon, and obtaining a magnetic resonance image by performing predetermined processing including image reconstruction processing for the magnetic resonance signal, comprising:

a first step of generating a 180° pulse at a timing at which a peak of the 180° pulse appears at $t = TE'/2$, assuming that $TE' = TE - n\tau c$ (where TE is the echo time for a proton, $\tau c$ is the period in which phases of spins of water and fat match with each other and which is obtained on the basis of a chemical shift amount of protons of water and fat, and n is an integer not less than 1), and a peak of a 90° pulse appears at $t = 0$, so as to generate a magnetic resonance echo signal;

a second step of generating a read gradient magnetic field Gr whose strength condition is set to cause an echo peak to appear at $t = TE = TE' + n\tau c$; and a third step of generating a slicing gradient magnetic field Gs whose strength condition is set to obtain a predetermined view angle $\theta = \tan^{-1}(Gs/Gr)$ for reducing chemical shift artifacts upon generation of the read gradient magnetic field Gr and to cause an echo peak value to be maximum at the echo peak defined by the read gradient magnetic, field Gr.

5. A method according to claim 4, further comprising a fourth step of generating an encode gradient magnetic field Ge between application of 90° and 180° pulses, and a fifth step of generating a read gradient magnetic field Gr and a slicing gradient magnetic field Gs whose strengths are set in accordance with the strength conditions upon generation of the encode gradient magnetic field Ge.

6. A magnetic resonance imaging method of applying a predetermined gradient magnetic field and 90°-180° series RF pulses to a predetermined imaging volume in a static magnetic field in which an object to be examined is placed to cause a magnetic resonance phenomenon in a predetermined portion in the imaging volume, receiving a magnetic resonance signal generated by the magnetic resonance phenomenon, and obtaining a magnetic resonance image by performing predetermined processing including image reconstruction processing for the magnetic resonance signal, comprising:

a first step of generating a 180° pulse at a timing at which a peak of the 180° pulse appears at $t = TE'/2$, assuming that $TE' = TE - n\tau c$ (where TE is the echo time for a proton, $\tau c$ is the period in which phases of spins of water and fat match with each other and which is obtained on the basis of a chemical shift amount of protons of water and fat, and n is an integer not less than 1), and a peak of a 90° pulse appears at $t = 0$, so as to generate a magnetic resonance echo signal;

a second step of generating a read gradient magnetic field Gr whose strength condition is set to cause an echo peak to appear at $t = TE = TE' + n\tau c$; and a third step of generating an nth (n is a natural number not less than 2) magnetic resonance echo signal by repeatedly applying 180° pulses at predetermined intervals after generation of the first magnetic resonance echo signal; and a fourth step of generating a slicing gradient magnetic field Gs whose strength condition is set to obtain a predetermined view angle $\theta = \tan^{-1}(Gs/Gr)$ for reducing chemical shift artifacts upon generation of the read gradient magnetic field Gr and to cause an echo peak value to be maximum at the echo peak defined by the read gradient magnetic field Gr.

* * * * *